(12) United States Patent
Inaba et al.

(10) Patent No.: US 9,176,013 B2
(45) Date of Patent: Nov. 3, 2015

(54) SENSOR, ELECTRONIC APPARATUS, ROBOT, AND MOBILE OBJECT

(71) Applicant: Seiko Epson Corporation, Tokyo (JP)

(72) Inventors: Shogo Inaba, Shiojiri (JP); Kyo Horie, Okaya (JP)

(73) Assignee: Seiko Epson Corporation (JP)

( * ) Notice: Subject to any disclaimer, the term of this patent is extended or adjusted under 35 U.S.C. 154(b) by 100 days.

(21) Appl. No.: 14/044,992

(22) Filed: Oct. 3, 2013

(65) Prior Publication Data

US 2014/0102217 A1    Apr. 17, 2014

(30) Foreign Application Priority Data

Oct. 12, 2012  (JP) ................. 2012-226669

(51) Int. Cl.
| | | |
|---|---|---|
| G01L 1/10 | (2006.01) | |
| G01P 15/097 | (2006.01) | |
| G01P 15/18 | (2013.01) | |
| G01L 1/14 | (2006.01) | |
| H03H 9/24 | (2006.01) | |

(52) U.S. Cl.
CPC ... *G01L 1/10* (2013.01); *G01L 1/14* (2013.01); *G01P 15/097* (2013.01); *G01P 15/18* (2013.01); *H03H 9/2457* (2013.01)

(58) Field of Classification Search
CPC .......... G01G 3/16; G01L 1/162; G01L 3/045; G01L 1/10
USPC .................... 73/777, 849, 778, 812
See application file for complete search history.

(56) References Cited

U.S. PATENT DOCUMENTS

| | | | | |
|---|---|---|---|---|
| 3,995,433 | A * | 12/1976 | Dick ................ | 60/721 |
| 4,006,597 | A * | 2/1977 | Dick ................ | 60/721 |
| 4,751,849 | A * | 6/1988 | Paros et al. ........ | 73/862.59 |
| 5,553,506 | A * | 9/1996 | Benz et al. ......... | 73/862.59 |
| 6,214,243 | B1 * | 4/2001 | Muenzel et al. ..... | 216/2 |
| 7,701,312 | B2 * | 4/2010 | Park et al. ......... | 333/187 |
| 7,999,635 | B1 * | 8/2011 | Quevy et al. ....... | 333/186 |
| 2004/0150398 | A1 * | 8/2004 | Champion et al. .... | 324/260 |
| 2008/0224241 | A1 | 9/2008 | Inaba et al. | |
| 2011/0221536 | A1 | 9/2011 | Inaba | |
| 2011/0278978 | A1 * | 11/2011 | Taniguchi et al. ... | 310/156.54 |

FOREIGN PATENT DOCUMENTS

| | | |
|---|---|---|
| JP | 06-248399 | 9/1994 |
| JP | 2010-166620 A | 7/2010 |
| JP | 2011-189423 A | 9/2011 |

* cited by examiner

*Primary Examiner* — Max Noori
(74) *Attorney, Agent, or Firm* — Harness, Dickey & Pierce, P.L.C.

(57) ABSTRACT

A sensor includes a flexible wafer substrate and an oscillator provided on a principal surface of the wafer substrate, and the oscillator deforms when an external force is applied to the wafer substrate.

17 Claims, 10 Drawing Sheets

SENSOR, ELECTRONIC APPARATUS, ROBOT, AND MOBILE OBJECT

BACKGROUND

1. Technical Field

The present invention relates to a sensor, an electronic apparatus, a robot, and a mobile object.

2. Related Art

Sensors are used in a variety of fields related to our lives, such as automobile, aerospace, medicine, industries, and robots. Examples of dynamic, mechanical sensors include a pressure sensor, a strain sensor, an acceleration sensor, a force sensor, and an impact sensor, each of which has a variety of forms according to applications. Further, sensors nowadays are increasingly required to improve detection precision and detection speed and achieve size reduction and advanced functions of the detectors irrespective of quantities to be detected by the sensors, such as force, temperature, magnetic force, illuminance, and sound.

In the situations described above, a strain gauge formed of a resistive member attached to a flexible film-shaped member is known as a strain sensor of related art. For example, JP-A-6-248399 proposes a strain gauge formed of a resistive member made of an amorphous alloy. JP-A-6-248399 states that a compact, high-sensitivity strain gauge that excels in resistance against various environments and in fatigue life characteristics is provided by selecting an appropriate composition of the amorphous alloy that forms the resistive member.

The strain sensor (strain gauge) in the form described in JP-A-6-248399, however, has a difficulty further reducing the size of the detector. Specifically, since it is necessary to separately provide the strain gauge and a circuit that detects a change in resistance of the strain gauge and connect the strain gauge to the circuit with lead wires, it is difficult to achieve further size reduction. Further, the configuration described above disadvantageously, for example, makes manufacturing steps complicated and reduction in manufacturing cost difficult.

SUMMARY

An advantage of some aspects of the invention is to solve at least a part of the problems described above, and the invention can be implemented as the following application examples or aspects:

Application Example 1

This application example is directed to a sensor including a flexible substrate and a resonator provided on a principal surface of the substrate, and the resonator is deformable when an external force is applied to the substrate.

According to this application example, the sensor includes a resonator provided on a principal surface of a flexible substrate, and the resonator deforms when an external force is applied to the substrate. Since the resonance characteristics of the resonator change when it deforms, the external force applied to the substrate can be detected by observing the changing resonance characteristics. The sensor including the resonator can therefore detect an external force applied to the sensor.

Application Example 2

This application example is directed to the sensor according to the application example described above, wherein the resonator includes a first electrode disposed on the principal surface of the substrate, and a second electrode set apart from the first electrode and having an area that overlaps with the first electrode in a plan view of the substrate.

According to this application example, the resonator includes the first electrode disposed on the principal surface of the substrate and the second electrode having an area that overlaps with the first electrode with a gap between the first and second electrodes. When an external force is applied to the substrate, the first and second electrodes deform and the size of the gap between the first electrode and the second electrode changes. The deformation and the change in the distance between the electrodes readily change the resonance characteristics of the resonator. The configuration described above therefore allows detection of an external force with increased sensitivity.

Application Example 3

This application example is directed to the sensor according to the application example described above, wherein the first electrode or the second electrode, or the first and second electrodes deform when the substrate deforms, and a resonance frequency of the resonator changes.

According to this application example, the first electrode or the second electrode, or the first and second electrodes deform when the substrate deforms, and the resonance frequency of the resonator changes. Observation of the changing resonance frequency allows detection of an external force applied to the resonator. The sensor including the resonator can therefore detect an external force applied to the sensor.

Application Example 4

This application example is directed to the sensor according to the application example described above, wherein the resonator is surrounded by a wall provided on the principal surface of the substrate.

According to this application example, in which the resonator is disposed in a cavity provided above the principal surface of the substrate, a space in which the resonator oscillates is provided, and the resonator is protected by the outer wall that forms the cavity. Further, when the cavity is maintained at a reduced pressure, not only does the resonator readily oscillate and the oscillation readily changes but also the oscillation is stabilized, whereby the sensitivity and the stability of the sensor can be increased.

Application Example 5

This application example is directed to the sensor according to the application example described above, wherein the sensor includes a plurality of resonators.

According to this application example, the sensor includes a plurality of resonators, whereby the sensitivity and precision at which an external force is detected can be increased. Specifically, an external force can be detected in a widened area where the plurality of resonators are provided. Further, the detection precision can be improved by statistically processing a large amount of detected information. The statistical processing includes average calculation, removal of an abnormal value based on distribution analysis, and tendency understanding based on the distribution analysis.

Application Example 6

This application example is directed to the sensor according to the application example described above, wherein the plurality of resonators are so disposed that the directions in which the areas where the first electrode and the second electrode overlap with each other extend are oriented in different directions along the principal surface of the substrate in a plan view of the substrate.

According to this application example, the plurality of resonators are so formed that they are oriented indifferent directions along the principal surface (parallel to the principal surface) of the substrate. Further, the resonators are so deformed that the degrees thereof vary in accordance with the direction of an applied external force. The direction of the external force and a change in the direction of the external force can therefore be detected by analyzing the tendency of a change in the resonance characteristics of the resonators oriented in different directions.

Application Example 7

This application example is directed to the sensor according to the application example described above, which further includes a frequency detection circuit that detects the resonance frequency.

In this application example, in which the sensor includes a frequency detection circuit that detects the resonance frequency of the resonator, it is not necessary to provide a frequency detection circuit separately from the sensor and connect them to each other. Outputting a detected resonance frequency corresponds to outputting information on an external force acting on the sensor (substrate). Since the sensor can be formed in MEMS manufacturing steps, and the frequency detection circuit can also be formed in the same steps, a more compact sensor including a frequency detection circuit and capable of detecting an external force can be more readily manufactured at a lower cost.

Application Example 8

This application example is directed to the sensor according to the application example described above, which further includes a storage section that stores at least one of the resonance frequency detected by the frequency detection circuit, the amount of change in the resonance frequency, a maximum and a minimum of the resonance frequency, and a maximum and a minimum of the amount of change in the resonance frequency.

According to this application example, in which a storage section that stores at least one of the resonance frequency detected by the frequency detection circuit, the amount of change in the resonance frequency, a maximum and a minimum of the resonance frequency, and a maximum and a minimum of the amount of change in the resonance frequency is further provided, information on a detected external force can be recorded. As a result, for example, reading the information recorded in the storage section allows analysis of information detected in the past. That is, a process and history representing external force application can be referred to and analyzed. Further, since the environment where information is referred to and analyzed can be separated from the sensor, the sensor can be disposed in a variety of locations, whereby the sensor can be used in a wider range of applications.

Application Example 9

This application example is directed to the sensor according to the application example described above, which further has a timer function, and temporal information is preferably added to information stored in the storage section.

According to this application example, in which a timer function is provided and temporal information is added to information stored in the storage section, a process and history representing external force application can be referred to and analyzed. As a result, the sensor can be used in a wider range of applications.

Application Example 10

This application example is directed to the sensor according to the application example described above, wherein the storage section stores information on the magnitude of the external force corresponding to the resonance frequency.

In this application example, in which the storage section stores information on the magnitude of the external force corresponding to the resonance frequency, the magnitude of the external force or information on the magnitude of the external force can be directly referred to based on the information on a detected resonance frequency. Specifically, for example, experimentally determining in advance the magnitude of an external force applied to the sensor and the value of the resonance frequency having changed due to the application of the external force and storing them in the storage section in the form of a correspondence table or a correspondence function allow the value of a detected resonance frequency to be used to derive a corresponding (estimated) value of an external force. As a result, no conversion is required whenever an external force is determined.

Application Example 11

This application example is directed to an electronic apparatus including the sensor according to the application example described above.

Using the sensor described above as an electronic apparatus provides a more compact electronic apparatus that detects an external force or uses information on a detected external force at a lower cost than in related art.

Application Example 12

This application example is directed to a robot including the sensor according to the application example described above.

Using the sensor described above for a function of detecting an external force acting on a robot allows the robot to be more compact and inexpensive than in related art.

Application Example 13

This application example is directed to a mobile object including the sensor according to the application example described above.

Using the sensor described above for a function of detecting an external force acting on a mobile object allows the mobile object to be less expensive than in related art.

BRIEF DESCRIPTION OF THE DRAWINGS

The invention will be described with reference to the accompanying drawings, wherein like numbers reference like elements.

DESCRIPTION OF EXEMPLARY EMBODIMENTS

An embodiment in which the invention is implemented will be described below with reference to the drawings. The following description is presented as an embodiment of the invention and does not limit the invention. The following drawings are drawn in scales different from actual scales in some cases for ease of description.

Embodiment

A MEMS sensor will be described as an example of an embodiment of a sensor.

Figure 1A:
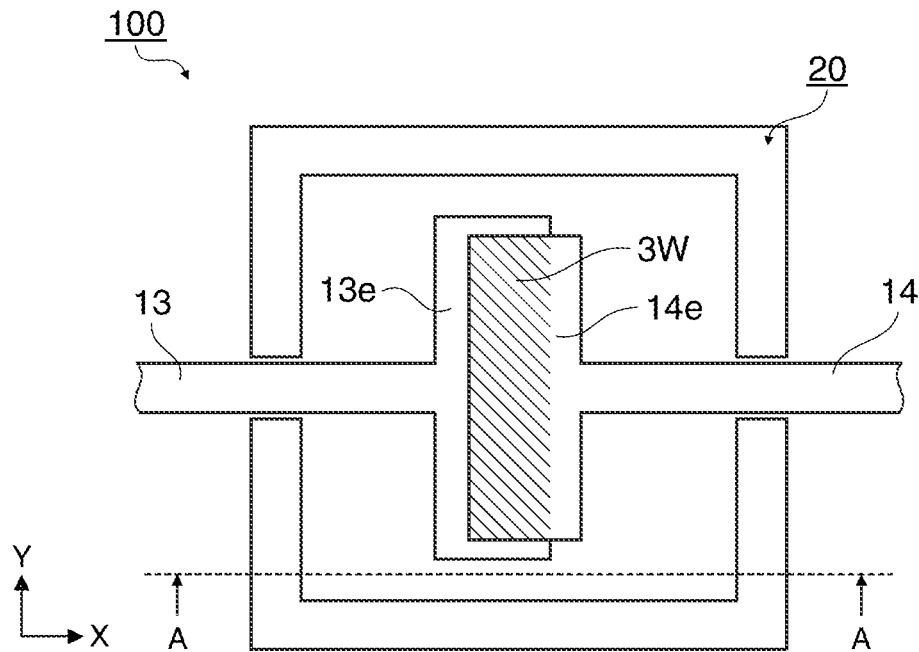
FIG. 1A is a plan view of a MEMS device that forms a MEMS sensor according to a first embodiment.
Figure 1B:
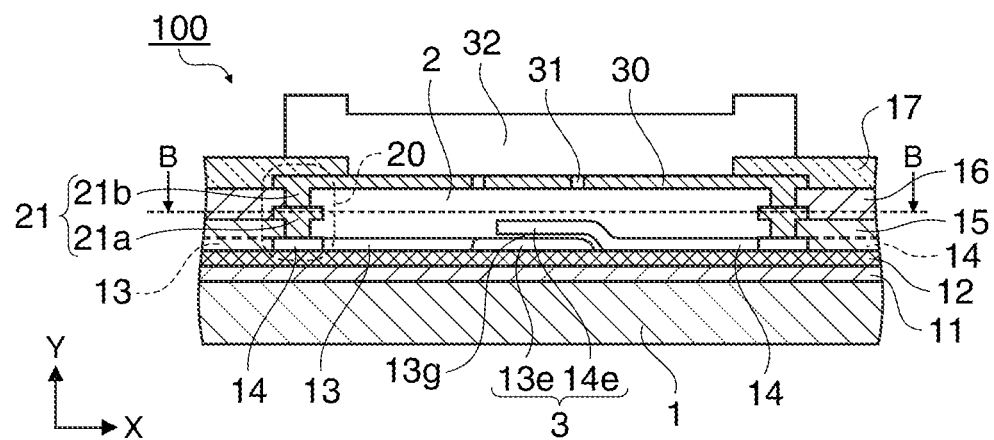
FIG. 1B is a cross-sectional view taken along a line A-A.

FIG. 1A is a plan view of a MEMS device 100, which forms the MEMS sensor according to the embodiment, and FIG. 1B is a cross-sectional view taken along a line A-A in FIG. 1A. FIG. 1A is a plan view in a plane B-B in FIG. 1B.

The MEMS device 100 includes a resonator formed on a principal surface of a flexible substrate.

The MEMS device 100 is formed, for example, of a wafer substrate 1, a cavity 2, a MEMS oscillator 3 as the resonator, a first oxide film 11, a nitride film 12, a first conductive layer 13, a second conductive layer 14, a second oxide film 15, a third oxide film 16, a protective film 17, a sidewall 20, a wiring layer 21, a first coating layer 30, etching holes 31, and a second coating layer 32.

The wafer substrate 1 is a flexible silicon substrate, and the MEMS oscillator 3 is formed above the first oxide film 11 and the nitride film 12 layered on the wafer substrate 1.

The following description will be made based on the following definition: the direction in which the first oxide film 11 and the nitride film 12 are sequentially layered on the principal surface of the wafer substrate 1 is an upward direction or a Z direction as shown in FIG. 1B.

The MEMS oscillator 3 includes a lower electrode 13e as a first electrode and an upper electrode 14e as a second electrode having a movable portion and is disposed in the cavity 2. The lower electrode 13e and the upper electrode 14e are formed by patterning the first conductive layer 13 and the second conductive layer 14 layered on the first oxide film 11 and the nitride film 12 in a photolithography process. Each of the first conductive layer 13 and the second conductive layer 14 is, but not necessarily, made of a conductive polysilicon as a preferable example.

A gap (air gap 13g) that forms a space where the upper electrode 14e is movable is formed between the lower electrode 13e and the upper electrode 14e. The cavity 2 and the air gap 13g are formed by removing the second oxide film 15 and the third oxide film 16 layered on the MEMS oscillator 3 and a fourth oxide film 13f (not shown) formed between the lower electrode 13e and the upper electrode 14e in an etching (release etching) process. Each of the second oxide film 15, the third oxide film 16, and the fourth oxide film 13f is what is called a sacrifice layer, and they undergo the release etching process to form a cantilever-type movable electrode structure (resonator) in which the upper electrode 14e is free from the lower electrode 13e.

Further, each of the lower electrode 13e and the upper electrode 14e has a rectangular shape having sides in X and Y directions and elongated in the Y direction, as shown in FIG. 1A. The area where the lower electrode 13e and the upper electrode 14e overlap with each other (hereinafter referred to as area 3W) also has a rectangular shape elongated in the Y direction in a plan view of the wafer substrate 1. It is assumed in the following description that the direction in which the elongated area 3W extends is the direction in which the resonator extends. That is, in FIG. 1A, the direction in which the resonator extends is the Y direction.

The lower electrode 13e is electrically connected to an external circuit (not shown) via the first conductive layer 13. The lower electrode 13e and the first conductive layer 13 are formed as an integrated portion by patterning the layered first conductive layer 13 in a photolithography process.

The upper electrode 14e is electrically connected to the external circuit via the second conductive layer 14. The upper electrode 14e and the second conductive layer 14 are formed as an integrated portion by patterning the layered second conductive layer 14 in a photolithography process.

In the MEMS oscillator 3 having the structure described above, an electrostatic force from charge produced by an AC voltage applied between the electrodes (lower electrode 13e and upper electrode 14e) causes the upper electrode 14e to oscillate as the second electrode. A resonance frequency signal specific to the oscillator is outputted between the electrodes.

The external circuit can be configured as a semiconductor circuit integral with the MEMS device 100. That is, not only the second conductive layer 14, which forms the upper electrode 14e, but also the first oxide film 11, the second oxide film 15, the third oxide film 16, the fourth oxide film 13f, and the protective film 17, which serve as interlayer films, protective films, or other insulating films, and the wiring layer 21 (first wiring layer 21a and second wiring layer 21b), which serves as a circuit wiring layer, can be components that form the semiconductor circuit as an integrated component. In other words, the MEMS device 100 can be formed in manufacturing steps of the semiconductor circuit.

A MEMS oscillator having a movable electrode made of a semiconductor material, in particular, can be manufactured in semiconductor processes more readily than an oscillator made, for example, of quartz.

A description will next be made of a mechanism based on which the MEMS oscillator 3 detects the magnitude of an external force acting on the wafer substrate 1.

Figure 2A:
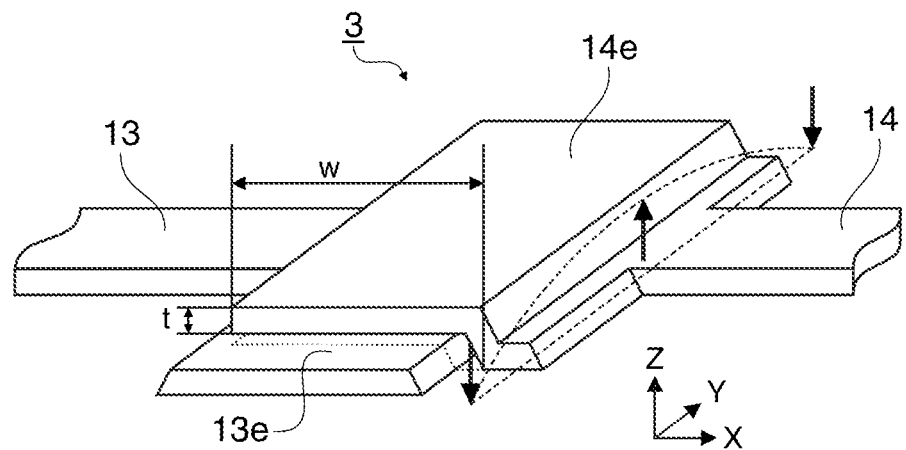
FIG. 2A is a perspective view of a MEMS oscillator.
Figure 2B:
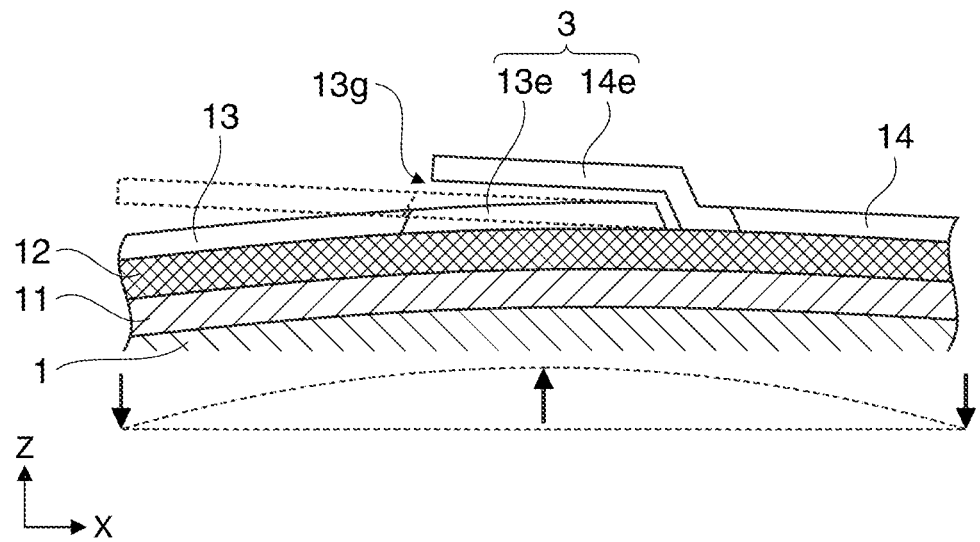
FIG. 2B is a cross-sectional view thereof.

FIG. 2A is a perspective view showing the MEMS oscillator 3, and FIG. 2B is a cross-sectional view thereof.

The upper electrode 14e has a support portion fixed to the underlying nitride film 12 and serving as a support point, and a side portion of the upper electrode 14e that is opposite to the support portion oscillates in the upward and downward directions. The resonance frequency (natural oscillation frequency) in this case is dependent, for example, on Young's modulus and the density of the material of which the upper electrode 14e is made, the thickness t, the flap length w, and other factors of the upper electrode 14e, or the spring constant of the upper electrode 14e.

The MEMS oscillator 3 is disposed on the principal surface of the wafer substrate 1, and when the wafer substrate 1 receives an external force and deforms, the MEMS oscillator 3 deforms accordingly. Specifically, when the wafer substrate 1 is flexed as indicated by the broken line in FIG. 2A (in convexly upward direction), for example, the flexure of the wafer substrate 1 causes the lower electrode 13e and a fixed portion of the upper electrode 14e to flex. The flexure of the fixed portion of the upper electrode 14e deforms a flap portion of the upper electrode 14e (portion free from lower electrode 13e). The deformation changes the spring constant of the upper electrode 14e, resulting in a change in the resonance frequency.

Further, for example, when the wafer substrate 1 flexes in a direction perpendicular to the direction shown in FIG. 2A, as indicated by the broken line in FIG. 2B, the flexure of the wafer substrate 1 causes the lower electrode 13e and the fixed portion of the upper electrode 14e to deform, and the size (length) of the air gap 13g between the lower electrode 13e and the upper electrode 14e changes accordingly. The change in the length of the air gap 13g changes the electric field intensity between the lower electrode 13e and the upper electrode 14e. The change in the electric field intensity changes Young's modulus of the material of which the upper electrode 14e is made, resulting in a change in the resonance frequency.

Figure 3A:
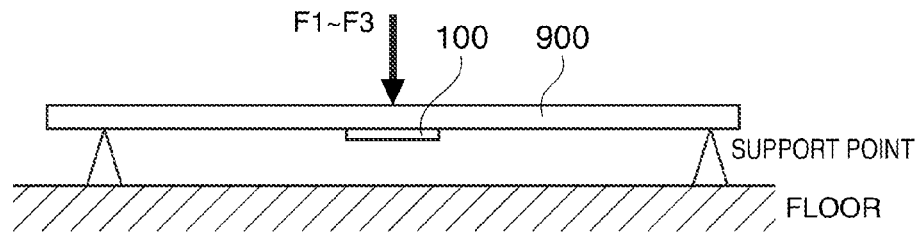
FIGS. 3A and 3B are schematic views showing a method for studying a change in resonance frequency.
Figure 3B:
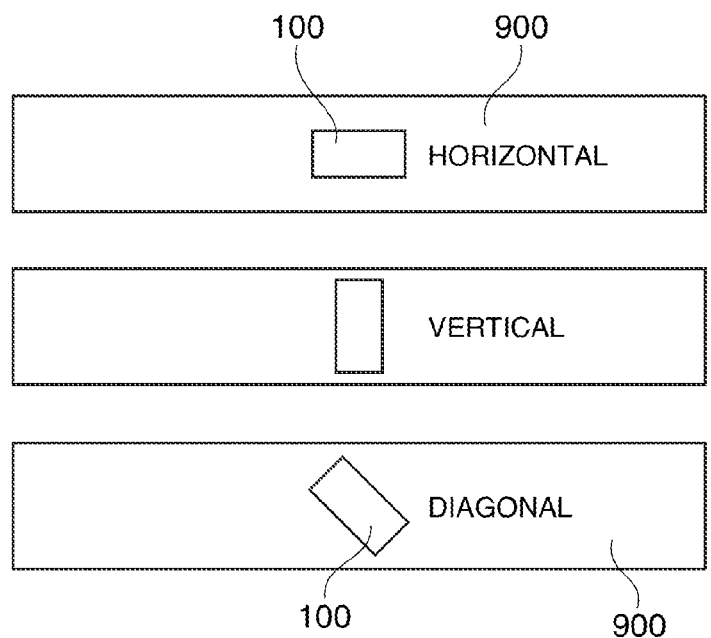
Figure 3C:
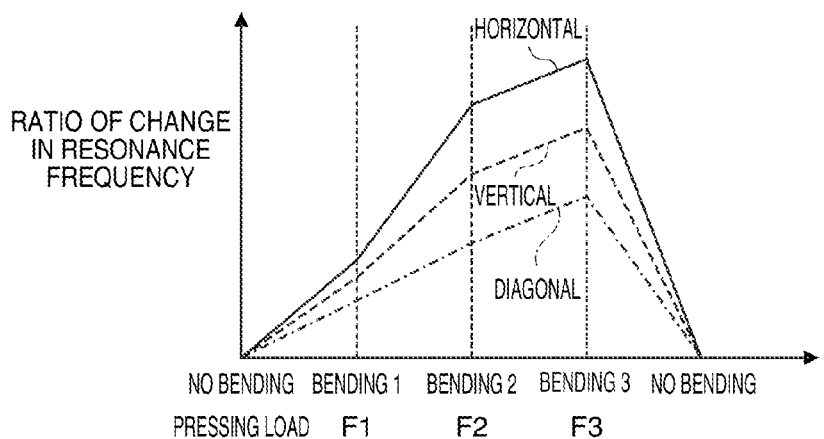
FIG. 3C shows graphs illustrating the ratio of change in the resonance frequency.

FIGS. 3A to 3C show a method by using which the change in the resonance frequency resulting from the flexure of the wafer substrate 1 was studied and results of the study.

First, an evaluation sample was so provided that the MEMS device 100 was attached to a central portion of an elastic member 900 having a rectangular-plate shape, as shown in FIG. 3B. Three types of evaluation sample were provided as follows: a sample to which the MEMS device 100 was "horizontally" attached in such a way that the direction in which the MEMS oscillator 3 (resonator) extends is the same as the longitudinal direction of the elastic member 900; a sample to which the MEMS device 100 was "vertically" attached in such away that the direction in which the MEMS oscillator 3 extends is perpendicular to the longitudinal direction of the elastic member 900; and a sample to which the MEMS device 100 was "diagonally" attached in a direction between those of the two samples described above.

Each of the samples was then set as follows: the surface to which the MEMS device 100 was attached faced downward; the elastic member 900 was supported at two end areas thereof in the longitudinal direction; and the elastic member 900 was so pressed and flexed that the rear surface to which the MEMS device 100 was attached was moved downward. Pressing loads having magnitudes F1, F2 and F3, F1<F2<F3, were sequentially applied to produce bending states of the evaluation samples, bending 1, bending 2, and bending 3. Values of the resonance frequency of the three types of evaluation sample were measured in the following states; an initial state (no bending); the three bending states, bending 1, bending 2, and bending 3; and a state in which the pressing loads were removed (no bending again).

In FIGS. 3A to 3C, an electric circuit that causes the MEMS device 100 to resonate and a circuit that measures the frequency are omitted.

FIG. 3C shows graphs illustrating results of the evaluation of the change in the resonance frequency. In FIG. 3C, in which the evaluation results are plotted, the horizontal axis represents the bending state, and the vertical axis represents the ratio of change in the resonance frequency of each of the bending states to the initial state.

As shown in FIG. 3C, the resonance frequency changes with the magnitude of the pressing load from F1 to F3. Further, the ratio of change in the resonance frequency varies among the samples, on which the MEMS oscillator 3 extends in the different directions with respect to the direction in which the elastic member 900 flexes.

As described above, the MEMS device 100 can detect the magnitude of the force F acting on the wafer substrate 1 based on the change in the resonance frequency resulting from flexure of the wafer substrate 1. Further, the fact that the ratio of change in the resonance frequency changes in accordance with the orientation of the MEMS oscillator 3 (direction in which MEMS oscillator 3 extends) allows, for example, detection of the direction of flexure by using a plurality of differently oriented MEMS devices 100.

A description will next be made of specific embodiments in which the MEMS device 100 having the function described above is used as a MEMS sensor.

Figure 4A:
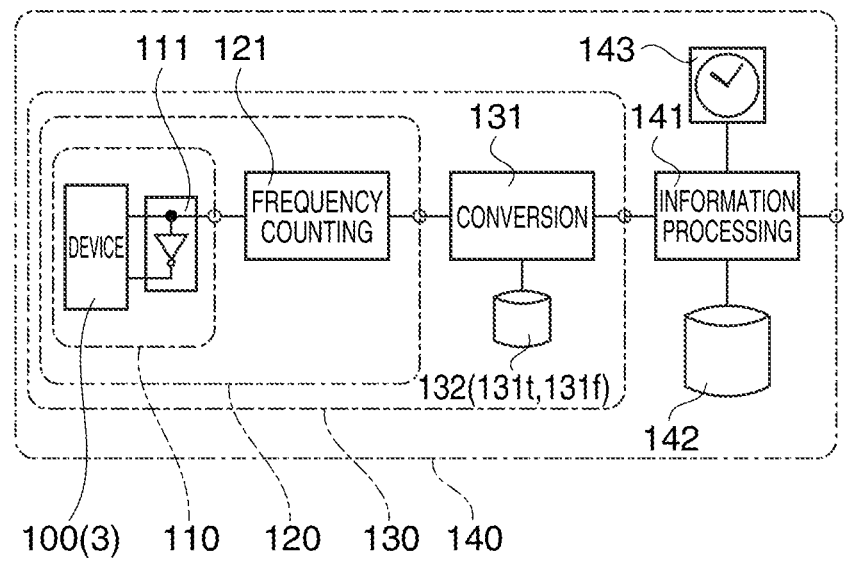
FIG. 4A is a conceptual diagram showing an example of each stage of specific embodiments of the MEMS sensor (first to fifth embodiments)

FIG. 4A is a conceptual diagram showing an example of the stage (functional level) of each of the specific embodiments of the MEMS sensor. The MEMS sensor can be implemented as embodiments having a variety of functional levels, such as a level at which the MEMS device 100 is used on a standalone basis and a level at which a function of storing detected information along with temporal information is added.

FIG. 4A shows the MEMS device 100 and MEMS sensors 110, 120, 130, and 140 as first to fifth embodiments.

First Embodiment

A first embodiment is an example in which the MEMS device 100 alone forms a MEMS sensor. Specifically, the MEMS device 100 is formed on the wafer substrate 1, and a chip on which the MEMS device 100 is formed is cut off and attached to a surface of an object to be detected for detection of deformation of the surface of the object to be detected. To use the MEMS device 100 as a MEMS sensor, a circuit that causes the MEMS oscillator 3 to resonate, a circuit that detects the resonance frequency, and other components are configured as an external electric circuit, which is connected to the first conductive layer 13 and the second conductive layer 14, for example, with bonding wires.

According to the present embodiment, when the surface of the object to be detected deforms due to an external force or any other cause, the MEMS device 100 outputs a resonance frequency signal via the external electric circuit. The resonance frequency signal changes when the MEMS oscillator 3 deforms in response to the deformation of the surface of the object. Specifically, the MEMS oscillator 3 is formed of the lower electrode 13e and the upper electrode 14e disposed on the principal surface of the wafer substrate 1, and when an external force is applied to the wafer substrate 1, the lower electrode 13e and the upper electrode 14e deform and the size of the gap between the lower electrode 13e and the upper electrode 14e changes. The deformation and the change in the distance between the electrodes readily change the resonance characteristics of the MEMS oscillator 3. According to the configuration described above, observation of the changing resonance frequency signal therefore allows detection of the magnitude of the cause of the deformation, such as an external force applied to the wafer substrate 1.

Further, in the present embodiment, in which the MEMS oscillator 3 is disposed in the cavity 2 provided above the principal surface of the wafer substrate 1, a space where the MEMS oscillator 3 oscillates is provided, and the outer wall (wall portion) that forms the cavity 2 protects the MEMS oscillator 3. Further, when the cavity 2 is maintained at a reduced pressure, not only does the MEMS oscillator 3 readily oscillate and the oscillation readily changes but also the oscillation is stabilized, whereby the sensitivity and stability of the sensor can be increased.

Second Embodiment

A second embodiment relates to the MEMS sensor 110 and shows an example in which an electric circuit 111, such as a resonance circuit, is added as an external circuit to the MEMS device 100.

As described above, the external circuit can be configured as a semiconductor circuit integral with the MEMS device 100. Specifically, the MEMS device 100, the electric circuit 111, and other components are formed on the wafer substrate 1, and a chip on which the above components are formed is cut off and attached to a surface of an object to be detected for detection of deformation of the surface of the object to be detected. To use the MEMS sensor 110, a power source that supplies electric power to the electric circuit 111, a circuit that detects the resonance frequency, and other components are configured as an external electric circuit, which is connected to the chip that forms the MEMS sensor 110, for example, with bonding wires.

According to the present embodiment, when the surface of the object to be detected deforms due to an external force or any other cause, the MEMS sensor 110 outputs a resonance frequency signal via the electric circuit 111. The resonance frequency signal changes when the MEMS oscillator 3 deforms in response to the deformation of the surface of the object. Observation of the changing resonance frequency signal allows detection of the magnitude of the cause of the deformation, such as an external force applied to the wafer substrate 1.

Third Embodiment

A third embodiment relates to the MEMS sensor 120 and shows an example in which a frequency counter 121 as a frequency detection circuit and other components are added to the MEMS sensor 110. Specifically, the MEMS sensor 110, the frequency counter 121, and the other components are formed on the wafer substrate 1, and a chip on which the above components are formed is cut off and attached to a surface of an object to be detected for detection of deformation of the surface of the object to be detected.

The frequency counter is formed of a logic circuit that, for example, has an internal reference clock and cuts the changing resonance frequency signal at a predetermined threshold to count the number of cycles. To use the MEMS sensor 120, a power source circuit that supplies electric power to the MEMS sensor 110 and the frequency counter 121, a circuit that receives and processes information on a detected resonance frequency, and other components are configured as an external electric circuit, which is connected to the chip that forms the MEMS sensor 120, for example, with bonding wires. The MEMS sensor 120 outputs the detected resonance frequency in the form of digital information.

According to the present embodiment, providing the frequency counter 121 as a frequency detection circuit that detects the resonance frequency of the MEMS oscillator 3 eliminates a need to provide a frequency detection circuit separately from the MEMS sensor and connect them to each other. Outputting a detected resonance frequency corresponds to outputting information on an external force acting on the MEMS sensor 120 (wafer substrate 1). Since the MEMS sensor 120 can be formed in MEMS manufacturing steps, and the frequency counter 121 can also be formed in the same steps, a more compact MEMS sensor including a frequency detection circuit and capable of detecting an external force can be more readily manufactured at a lower cost.

Fourth Embodiment

A fourth embodiment relates to the MEMS sensor 130 and shows an example in which a conversion section 131, a storage section 132, and other components are added to the MEMS sensor 120.

The conversion section 131 is an electric circuit that converts information on the resonance frequency outputted from the MEMS sensor 120 into different-dimension information corresponding to a detected frequency, and the storage section 132 is a storage medium (memory) that stores computation information for the conversion. Specifically, the MEMS sensor 120, the conversion section 131, the storage section 132, and the other components are formed on the wafer substrate 1, and a chip on which the above components are formed is cut off and attached to a surface of an object to be detected for detection of information corresponding to deformation of the surface of the object to be detected. To use the MEMS sensor 130, a power source circuit that supplies electric power to the MEMS sensor 120, the conversion section 131, the storage section 132, and the other components, a circuit that receives and processes information on detected and converted information, and other components are configured as an external electric circuit, which is connected to the chip that forms the MEMS sensor 130, for example, with bonding wires.

The conversion section 131 includes a computation portion and converts a detected frequency into different-dimension information corresponding to the detected frequency by using a conversion table 131*t* or a conversion function 131*f* as the computation information for the conversion and outputs the converted information. For example, when the relationship between the pressing load and the resonance frequency is experimentally or otherwise known in advance as indicated by the graphs shown in FIG. 3C, the MEMS sensor 130 can perform the computation by using the conversion table or conversion function that converts the resonance frequency to the pressing load, whereby the MEMS sensor 130 can function as a pressing load sensor.

The different-dimension information is not limited to the pressing load and may be information on the pressing load, such as the amount of bending and the amount of flexure. Alternatively, the resonance frequency may be directly outputted without conversion.

According to the present embodiment, in which information on the magnitude of an external force corresponding to the resonance frequency or the magnitude related to the external force is stored in the storage section 132, the magnitude of the external force or the magnitude related to the external force can be directly referred to based on the information on a detected resonance frequency. Specifically, for example, experimentally determining in advance the magnitude of an external force applied to the MEMS sensor 130 and the value of the resonance frequency having changed due to the application of the external force and storing them in the storage section 132 in the form of a correspondence table or a correspondence function allows the value of a detected resonance frequency to be used to derive a corresponding (estimated) value of an external force. As a result, no conversion is required whenever an external force is determined.

Fifth Embodiment

A fifth embodiment relates to the MEMS sensor 140 and shows an example in which an information processing section 141, a storage section 142, a timepiece 143 as a timer function, and other components are added to the MEMS sensor 130.

The information processing section 141 includes a computation portion and an information input/output portion and has a function of adding temporal information obtained from the timepiece 143 to detected information outputted from the MEMS sensor 130 and recording the resultant information in the storage section 142 and a function of inputting and outputting information from and to an external apparatus. Specifically, the MEMS sensor 130, the information processing section 141, the storage section 142, the timepiece 143, and the other components are formed on the wafer substrate 1, and a chip on which the above components are formed is cut off and attached to a surface of an object to be detected for detection of information corresponding to deformation of the surface of the object to be detected and communication of the information with the external apparatus. To use the MEMS sensor 140, a power source circuit that supplies electric power to the MEMS sensor 130, the information processing section 141, the storage section 142, the timepiece 143, and the other components, a circuit that receives and processes information on detected and converted information, and other components are configured as an external electric circuit, which is connected to the chip that forms the MEMS sensor 140, for example, with bonding wires.

Figure 4B:
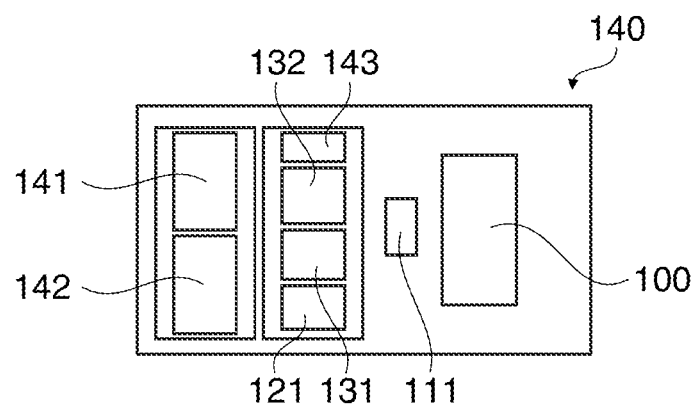
FIG. 4B is a plan view of a MEMS sensor according to the fifth embodiment configured in the form of a chip-shaped device.

FIG. 4B is a plan view showing the MEMS sensor 140 configured in the form of a chip-shaped device. The circuit blocks described above are combined into a single chip.

The temporal information used herein includes information on time obtained from the timepiece 143 and information on a period obtained in the form of a time information difference.

The information processing section 141, for example, adds temporal information to detected information outputted from the MEMS sensor 130, calculates the amount of change in the detected information, calculates a maximum and a minimum of the detected information within a predetermined period, and calculates a maximum and a minimum of the amount of change in the detected information within the predetermined period. The information processing section 141 can further send and receive information to and from an external circuit, for example, to rewrite the computation information (such as conversion table 131$t$ and conversion function 131$f$) used in the conversion process carried out by the conversion section 131.

The information processing section 141 may, for example, include a CPU (central processing unit) so that the conversion section 131 is included in the information processing section 141 as part of the computation function of the information processing section 141. Further, both the storage section 132 and the storage section 142 are not necessarily provided but they may be integrated into a single storage section.

According to the present embodiment, in which the timepiece function (timepiece 143) is provided and stored temporal information is added to information stored in the storage section 132, a process and history representing external force application along with temporal information can be referred to and analyzed. As a result, the MEMS sensor can be used in a greatly wider range of applications.

Sixth Embodiment

Figure 5A:
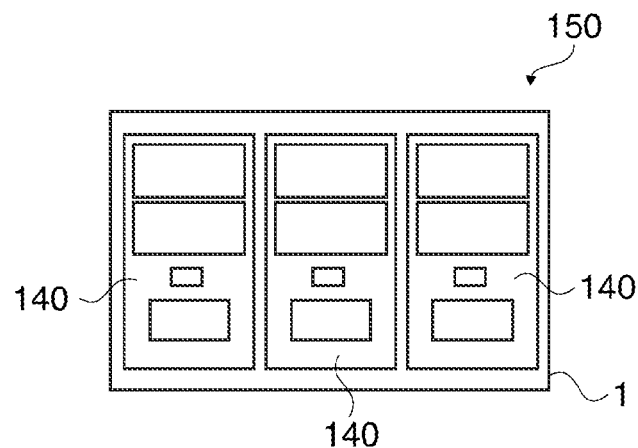
FIGS. 5A to 5C are plan views showing MEMS sensors according to a sixth embodiment.
Figure 5B:
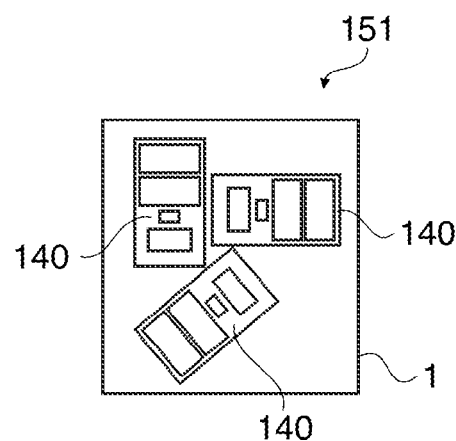
Figure 5C:
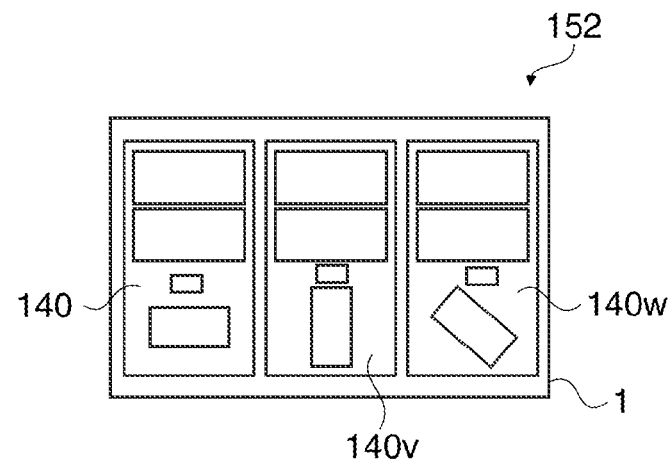

FIGS. 5A to 5C show MEMS sensors 150 to 152 as a sixth embodiment.

The sixth embodiment is characterized in that a plurality of MEMS sensors are incorporated.

The MEMS sensor 150 is an example in which the plurality of MEMS sensors 140 are incorporated in a single chip. In the example shown in FIG. 5A, three MEMS sensors 140 are so incorporated in a single chip that they are oriented in the same direction.

According to the present embodiment, the MEMS sensor 150 includes the plurality of MEMS oscillators 3 oriented in the same direction, whereby the sensitivity and precision at which an external force is detected can be increased. Specifically, an external force can be detected in a widened area where the plurality of MEMS oscillators 3 are provided. Further, the detection precision can be improved by statistically processing a large amount of detected information. The statistical processing includes average calculation, removal of an abnormal value based on distribution analysis, and tendency understanding based on the distribution analysis.

The MEMS sensor 151 is an example in which the plurality of MEMS sensors 140 are so incorporated in a single chip that they are oriented in different directions. In the example shown in FIG. 5B, three MEMS sensors 140 are so incorporated in a single chip that the directions in which the MEMS oscillators 3 provided in the MEMS sensors 140 extend are oriented in different directions parallel to the principal surface of the wafer substrate 1.

According to the present embodiment, in which the plurality of MEMS oscillators 3 are so formed that they are oriented in different directions parallel to the principal surface of the wafer substrate 1, the MEMS oscillators 3 are so deformed that the degrees thereof vary in accordance with the direction of an applied external force. The direction of the external force and a change in the direction of the external force can therefore be detected by analyzing the tendency of a change in the resonance characteristics of the MEMS oscillators 3 oriented in different directions.

The MEMS sensor 152 is an example in which a plurality of MEMS sensors are so incorporated in a single chip that the MEMS oscillators 3 provided therein are oriented in different directions. In the example shown in FIG. 5C, three MEMS sensors 140, 140$v$, and 140$w$ including MEMS oscillators 3 so formed that they are oriented in different directions parallel to the principal surface of the wafer substrate 1 are incorporated in a single chip.

According to the present embodiment, since the MEMS sensors are more efficiently laid out on the chip than in the MEMS sensor 151, whereby the size of the chip can be reduced.

Each of the MEMS sensors in the first to sixth embodiments described above does not necessarily have a chip-like shape and only needs to have a shape that allows detection of deformation of a surface of an object to be detected. For example, the chip cut off the wafer substrate 1 may be mounted on a flexible film or a flexible thin substrate.

Further, in each of the embodiments, the external electric circuit that supplies electric power is preferably, for example, a dry battery, a chargeable battery, a solar battery, or any other portable compact power source.

A description will next be made of specific usage examples and usage forms of the MEMS device 100 and the MEMS sensors 110, 120, 130, 140, 150, 151, and 152 described above. In the description, the same components as those in the embodiments described above have the same reference characters, and no redundant description will be made.

In the following description, the MEMS device 100 and the MEMS sensors 110, 120, 130, 140, 150, 151, and 152 are collectively called a MEMS sensor 500. That is, the MEMS sensor 500 may be the MEMS sensor in any of the embodiments described above. It is, however, noted that the external electric circuit necessary in each of the embodiments described above is omitted in the illustration and description.

Example 1

Figure 6A:
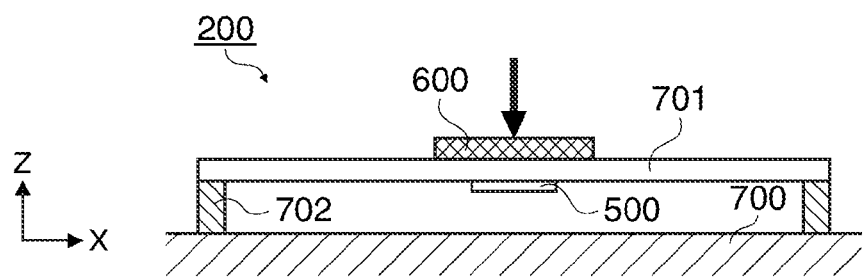
FIG. 6A is a side view showing Example 1, in which a MEMS sensor is used as an impact sensor.

FIG. 6A is a side view showing Example 1, in which the MEMS sensor 500 is used as an impact sensor 200.

The impact sensor 200 is formed, for example, of the MEMS sensor 500, a base member 700, an elastic plate 701, a support member 702, and a weight 600.

The base member 700 is a substrate that forms an enclosure of the impact sensor 200 and formed, for example, of a metal plate or a resin plate more rigid than the elastic plate 701.

The elastic plate 701 is a rectangular substrate made of a flexible elastic material. The MEMS sensor 500 is attached to a central portion of one surface of the elastic plate 701, and the weight 600 is attached to a central portion of the other surface, that is, the surface opposite to the surface to which the MEMS sensor 500 is attached.

The support member 702 supports both longitudinal ends of the elastic plate 701 and fixes the elastic plate 701 to the base member 700 while forming a gap between the elastic plate 701 and the base member 700.

The support member 702 preferably fixes the elastic plate 701 to the base member 700 without preventing the elastic plate 701 from undergoing flexure deformation.

In the thus configured impact sensor 200, for example, when the weight 600 receives a force in the direction of a normal to the elastic plate 701 (−Z direction indicated by arrow in FIG. 6A), the elastic plate 701 flexes. The degree of flexure can be detected by the MEMS sensor 500. For example, when the impact sensor 200 receives an impact in the Z direction in FIG. 6A, the elastic plate 701 flexes due to an inertial force in the −Z direction produced by the weight 600, and the impact sensor 200 can measure the degree of flexure. The degree of flexure represents the degree of impact having acted on the impact sensor 200, that is, the impact having acted on the impact sensor 200 can be detected.

The function of the impact sensor 200 can be used in conjunction with an integrated circuit having a variety of processing functions to achieve a compact, lightweight sensor apparatus having advanced functions. As a result, the sensor apparatus can be used in a wider range of applications.

For example, when the MEMS sensor 500 is formed of the MEMS sensor 140 and a battery is provided to supply electric power, the impact sensor 200 can detect and record impacts continuously acting on the impact sensor 200. For example, when several impact sensors 200 are attached to different surfaces of an object to be shipped and the object with the impact sensors 200 is packed and shipped, impacts acting on the object during the shipment can be recorded through a time course, and the history of impact during the shipment can be referred to and analyzed after the shipment.

Further, for example, to avoid aggressive oscillation and impact during shipment, a predetermined threshold of a detected value (acceptable range limit, for example) may be set. When the threshold is reached, an alarm may be issued for attention or any other similar usage is conceivable.

Further, impact resistance of a packing material, a shock absorbing material used in packing, a container, a transportation apparatus, or any other shipment-related material can be quantitatively evaluated. Specifically, for example, the sensor according to any of the embodiments of the invention is attached to each of a transportation apparatus, a container, an outer packing box, a shock absorbing material, an inner packing box, a case, contents, and other objects, and propagated strain produced by an externally applied impact and a propagating impact can be analyzed in an actual packing and shipping state.

Moreover, combining the MEMS sensor with a GPS (global positioning system) sensor allows recording of a temporal history of a received impact along with a location history. That is, for example, post-shipment reference to and analysis of the temporal and location histories of received impacts during shipment allows causes and other factors of the impacts to be identified. For example, when a fragile object or any other similar shipped object has been broken during shipment or transportation, information that allows causes of and responsibilities for the breakage to be clarified can be obtained.

Further, the impact sensor 200 can be used, for example, as a sport assistance device.

Specifically, the impact sensor 200 attached to a ball or an object equivalent to a ball can detect an action, such as throwing, hitting, and kicking of the ball or the object, in a ball sport in the form of impact, acceleration, force, or any other type of information. For example, the impact sensor 200 can be configured as a sport assistance device that feeds back an evaluation indicator of the quality of an action, for example, can be used to quantify impact strength and precision in a golf shot.

Another type of sport assistance is attaching the impact sensor 200 and a GPS sensor to an athletic shoe to quantify a load produced in a running action. Specifically, an impact acting on the athletic shoe is converted into the intensity of the running, and the intensity along with information on a running path and a running speed from the GPS sensor allows quantification of a total running load.

Example 2

Figure 6B:
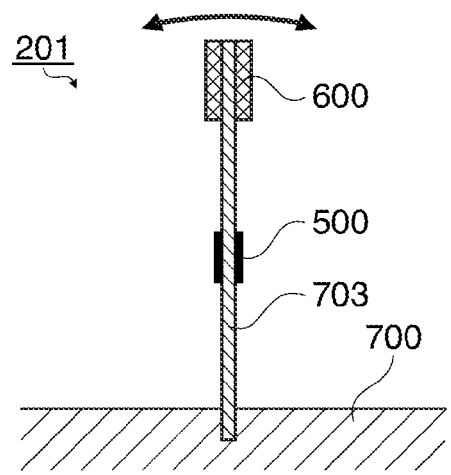
FIGS. 6B and 6C are conceptual diagrams of Example 2, in which a MEMS sensor is used as an earthquake intensity sensor.
Figure 6C:
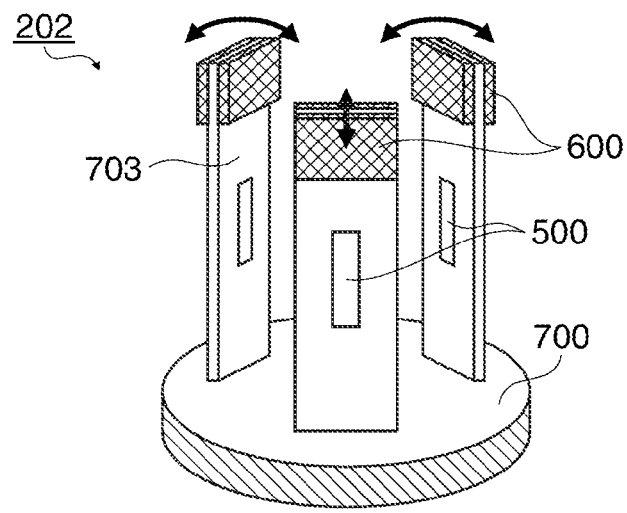

FIGS. 6B and 6C are conceptual diagrams showing a case where the MEMS sensor 500 is used as earthquake intensity sensors 201 and 202.

The earthquake intensity sensor 201 is formed, for example, of the MEMS sensor 500, the base member 700, an elastic plate 703, and the weight 600.

The base member 700 is a substrate that forms an enclosure of the earthquake intensity sensor 201 and formed of a metal plate or a resin plate more rigid than the elastic plate 703.

The elastic plate 703 is a rectangular substrate made of a flexible elastic material.

The MEMS sensor 500 is attached to a central portion of one surface of the elastic plate 703.

One longitudinal end of the elastic plate 703 is fixed to the base member 700. The weight 600 is attached to the other longitudinal end of the elastic plate 703.

In the thus configured earthquake intensity sensor 201, when a force acts on the base member 700 and moves it in such a way that the elastic plate 703 oscillates in the direction indicated by the arrow shown in FIG. 6B, for example, the elastic plate 703 flexes and oscillates by an amplitude according to the force (acceleration) acting thereon. The degree of flexure can be detected by the MEMS sensor 500. That is, when the elastic plate 703 is so set that it stands vertically and the base member 700 is fixed to the ground, for example, the intensity of lateral shaking of an earthquake (ground moving acceleration in horizontal direction) can be observed.

The earthquake intensity sensor 202 is an example in which a plurality of earthquake intensity sensors 201 are so combined that the plurality of elastic plates 703 oscillate in different directions. In the example shown in FIG. 6C, three earthquake intensity sensors 201 are so configured that they are oriented in different directions. Analyzing results of observation from the three earthquake intensity sensors 201, for example, allows detection of the orientation of oscillation.

The impact sensor 200 shown in Example 1 can also be used as an earthquake intensity sensor.

Example 3

Figure 7A:
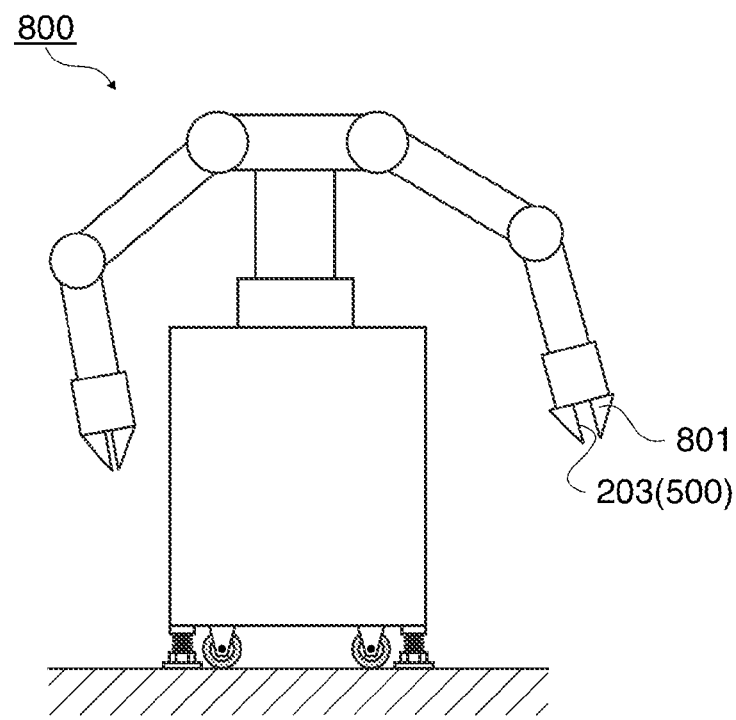
FIG. 7A is a conceptual diagram showing Example 3, in which a MEMS sensor is used as a force sensor for a robot.

FIG. 7A is a conceptual diagram showing Example 3, in which the MEMS sensor 500 is used as a force sensor 203 for a robot.

The force sensor 203 is attached to an object grasping surface of a hand 801 of a robot 800. A force acting on the object grasping surface can be detected based on the amount of flexure of the surface, whereby the MEMS sensor 500 can be used as a force sensor for the robot 800.

As a force sensor for a robot, a plurality of MEMS sensors 500, each of which can be very small, can be attached to a portion corresponding to a human finger, such as the hand 801. Further, the MEMS sensors 500 described above can be configured as sensors each including an integrated circuit that processes a detected signal, unlike a simple passive device that simply captures a detected signal, whereby a robot system in which a variety of types of detected information from the force sensors are processed at high speed can be configured without a large burden on a centralized controller of the robot.

Example 4

Figure 7B:
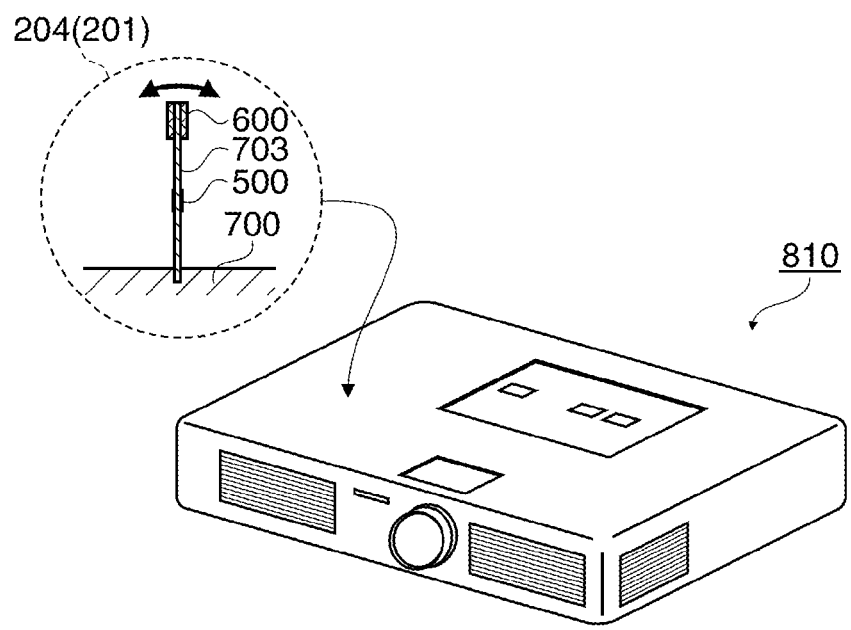
FIG. 7B is a conceptual diagram showing Example 4, in which a MEMS sensor is used as an inclination sensor.

FIG. 7B is a conceptual diagram showing Example 4, in which the MEMS sensor 500 is used as an inclination sensor 204. The inclination sensor 204 is built and used in a projector 810 for image projection.

The inclination sensor 204 detects the degree of inclination and is configured in the same manner as the earthquake intensity sensor 201 shown in FIG. 6B. When the elastic plate 703 is so set that it stands vertically and the base member 700 is placed horizontally, the elastic plate 703 does not flex and no external force resulting from flexure acts on the MEMS sensor 500. When the base member 700 is inclined in the direction in which the elastic plate 703 can flex, the gravity acting on the weight 600 flexes the elastic plate 703 in accordance with the degree of inclination of the base member 700. The degree of flexure can be detected by the MEMS sensor 500.

The projector 810 includes the two inclination sensors 204 in a main body thereof. Each of the inclination sensors 204 is so disposed that the elastic plate 703 extends vertically when the projector 810 is horizontally installed, and one of the inclination sensors 204 is inclinable forward or rearward along the direction in which the projector 810 projects an image, whereas the other inclination sensor 204 is inclinable in the direction perpendicular to the direction in which the one inclination sensor 204 is inclinable.

The one inclination sensor 204 can detect a projection angle with respect to a horizontal plane. Since the projection angle with respect to a vertically installed screen can, for example, therefore be detected, controlling an optical system or deforming a projected image in synchronization with an optical lens tilting mechanism allows automatic correction of an image obliquely projected and hence distorted.

The other inclination sensor 204 can detect how horizontally the projector 810 is installed (the degree of inclination with respect to the horizontal direction), that is, how horizontally an image is projected. When the projector 810 cannot be installed horizontally and hence a projected image is inclined, for example, the projected image can therefore be automatically adjusted in accordance with the detection result of how horizontally the projector 810 is installed in such a way that the image is horizontally projected.

Example 5

Figure 8:
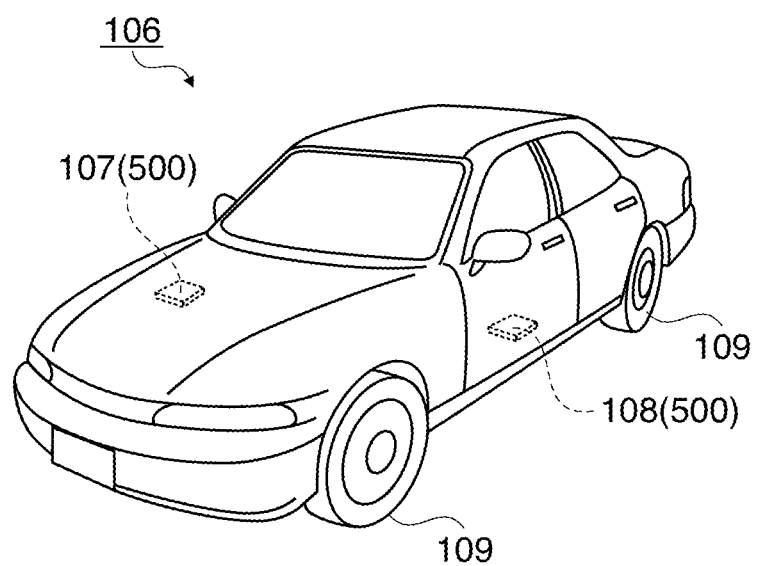
FIG. 8 is a perspective view schematically showing Example 5, in which a MEMS sensor is used in an automobile as an example of a mobile object.

FIG. 8 is a perspective view schematically showing Example 5, in which the MEMS sensor 500 is used in an automobile as an example of a mobile object. An automobile 106 accommodates the MEMS sensor 500 according to the embodiment of the invention.

The MEMS sensor 500 mounted on a substrate that flexes in accordance with acceleration can be used as an acceleration sensor. For example, in the automobile 106 as a mobile object, an electronic control unit 108, which controls tires 109 or any other components, accommodates an acceleration sensor formed of the MEMS sensor 500, as shown in FIG. 8.

The MEMS sensor 500 can also be used, for example, as an airbag impact sensor 107 and as a pressure sensor in a tire pressure monitoring system (TPMS).

Further, the MEMS sensor 500, which can provide the same function as that of an inertial measurement unit (IMU), can be similarly used in a field using an IMU.

As described above, the MEMS sensor 500 capable of detecting the magnitude of an external force, earthquake movement, and inclination can be used in an electronic apparatus or device to improve the function thereof. Since the MEMS sensor 500 is provided as a compact MEMS sensor whose compactness depends on the configuration thereof and ranges from the level of the MEMS device 100 to the levels of the MEMS sensors 110, 120, 130, 140, 150, 151, and 152 each having an internal built-in electric circuit, incorporating the MEMS sensor 500 does not require greatly changing the configuration of the electronic apparatus or device or increasing the size thereof.

The invention is not limited to the embodiments described above, and a variety of changes and modifications can be made thereto. Variations will be described below. In the following description, the same components as those in the embodiments described above have the same reference characters, and no redundant description will be made.

Variation 1

Figure 9A:
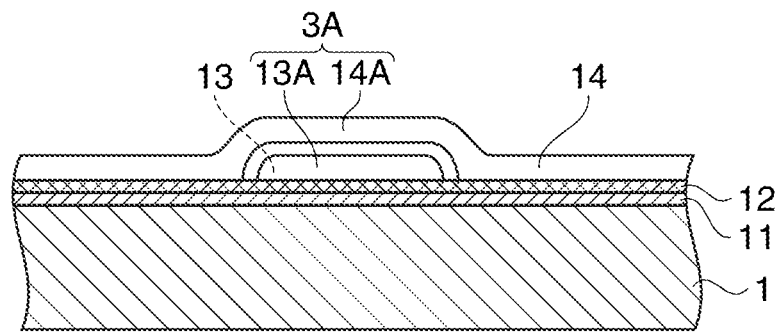
FIG. 9A is a cross-sectional view showing a MEMS oscillator according to Variation 1.

FIG. 9A is a cross-sectional view showing a MEMS oscillator 3A according to Variation 1.

The above embodiments have been described with reference to the case where the MEMS oscillator 3 has a cantilever-type, movable electrode structure in which the upper electrode 14e is free from the lower electrode 13e, but the MEMS oscillator 3 is not necessarily configured this way. The MEMS oscillator 3 only needs to have an oscillator structure whose oscillation characteristics change when it deforms due to deformation of the wafer substrate 1.

For example, the MEMS oscillator 3A shown in FIG. 9A has a movable electrode structure which has both ends supported and in which an upper electrode 14A is free from a lower electrode 13A. The MEMS oscillator 3 has a structure in which the upper electrode 14e has a cantilever portion (support portion fixed to underlying nitride film 12) serving as a support point, and a side portion of the upper electrode 14e that is opposite to the cantilever portion oscillates in the upward and downward directions, whereas the MEMS oscillator 3A has a structure in which the upper electrode 14A has both ends fixed (both end-side support portions of upper electrode 14A that are fixed to underlying nitride film 12) serving as support points, and a central portion of the upper electrode 14A oscillates in the upward and downward direction. The MEMS oscillator 3A is the same as the MEMS oscillator 3 except that the structure of the upper electrode 14A and hence the patterning of the first conductive layer 13 are different from those in the MEMS oscillator 3.

The MEMS oscillator 3A according to the present variation not only has the advantageous effects provided by the embodiments described above but also provides a more reliable MEMS oscillator and MEMS sensor than those in the embodiments described above. Specifically, changing the upper electrode 14e as a movable electrode having a cantilever structure to the upper electrode 14A having a structure with both ends fixed provides a structure more durable against deformation.

Variation 2

Figure 9B:
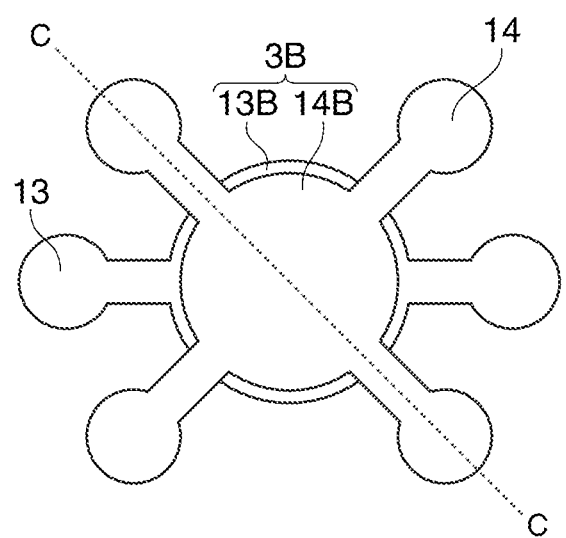
FIG. 9B is a plan view showing a MEMS oscillator according to Variation 2.

FIG. 9B is a plan view showing a MEMS oscillator 3B according to Variation 2. The above embodiments have been described with reference to the case where the MEMS oscillator 3 is so configured that the area 3W where the lower electrode 13e and the upper electrode 14e overlap with each other has a rectangular shape elongated in the Y direction as shown in FIG. 1A, but the MEMS oscillator 3 is not necessarily configured this way. The MEMS oscillator 3 only needs to have an oscillator structure whose oscillation characteristics change when it deforms due to deformation of the wafer substrate 1.

For example, the MEMS oscillator 3B shown in FIG. 9B is formed of a circular lower electrode 13B and a circular upper electrode 14B and so configured that the area where they overlap with each other has a circular shape. Further, the upper electrode 14B has support portions fixed to the underlying nitride film 12 in a plurality of locations (four locations in the example shown in FIG. 9B) around the upper electrode 14B.

The MEMS oscillator 3B according to the present variation, which has a structure in which the upper electrode 14B is supported by a plurality of support portions provided therearound, provides a structure more durable against deformation. Further, the lower electrode 13B and the upper electrode 14B, each of which has a horizontally and vertically symmetric pattern in a plan view, allow detection of deformation without being affected by the direction in which the wafer substrate 1 deforms.

Variation 3

In the embodiments and examples described above, the MEMS device 100 and the MEMS sensors 110, 120, 130, 140, 150, 151, and 152 are so configured or used that they are attached to a surface of an object to be detected or a surface of a flexible, elastic object, but the MEMS device and the MEMS sensors are not necessarily configured or used this way. The MEMS device 100 and the MEMS sensors 110, 120, 130, 140, 150, 151, and 152 may alternatively be used as they are or in the form of the substrate on which they are formed. When the substrate that forms any of the MEMS sensors deforms by itself due to an inertial force, the MEMS sensor used in the form of the substrate can detect the inertial force.

Figure 10A:
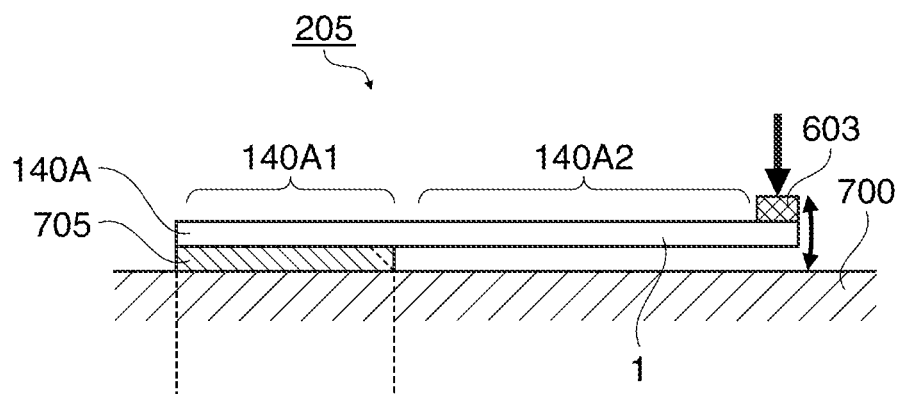
FIG. 10A is a side view showing a MEMS sensor according to Variation 3.
Figure 10B:
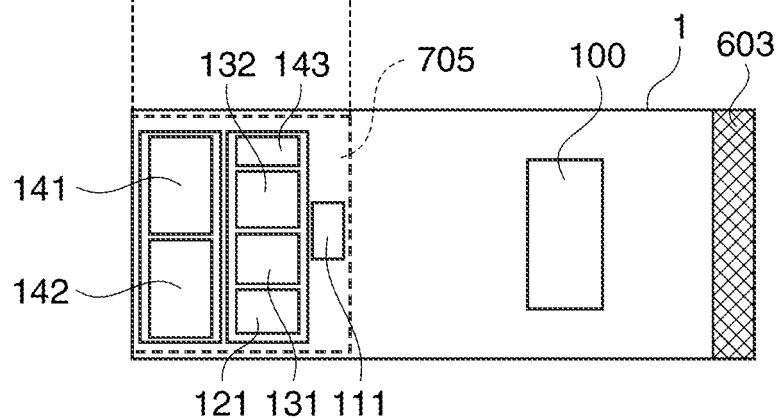
FIG. 10B is a plan view of the MEMS sensor.

FIG. 10A is a side view showing a MEMS sensor 205 according to Variation 3, and FIG. 10B is a plan view of the MEMS sensor 205.

The MEMS sensor 205 is formed, for example, of a MEMS sensor 140A, a weight 603, the base member 700, and a fixing member 705.

The MEMS sensor 140A is formed of the rectangular wafer substrate 1 and a MEMS device, an electric circuit, and other components formed on a principal surface of the wafer substrate 1. The configuration of the MEMS sensor 140A is the same as that of the MEMS sensor 140 and includes the MEMS device 100, the electric circuit 111, such as a resonance circuit, the frequency counter 121, the conversion section 131, the storage section 132, the information processing section 141, the storage section 142, the timepiece 143 as a timer function.

The MEMS sensor 140A has one area 140A1 having a rectangular shape and extending in the longitudinal direction, and the rear surface of the one area 140A1 is fixed to the base member 700 via the fixing member 705. The fixing member 705, which functions as a spacer, forms a gap between the MEMS sensor 140A and the base member 700, and the MEMS sensor 140A is fixed to the base member 700 in a cantilever structure.

The weight 603 is attached to a principal surface of the MEMS sensor 140A in the other longitudinal end portion of the rectangular shape and extends along the short side thereof.

The MEMS device 100 is formed on the principal surface in a central portion of an area 140A2, which is outside the area 140A1 and the area where the weight 603 is attached.

The electric circuit 111, the frequency counter 121, the conversion section 131, the storage section 132, the information processing section 141, the storage section 142, the timepiece 143 as a timer function, and other components are formed on the principal surface of the area 140A1.

In the thus configured MEMS sensor 205, when the weight 603 receives a force in the direction of a normal to the MEMS sensor 140A (direction indicated by arrow in FIG. 10A), for example, the MEMS sensor 140A flexes within the range of the area 140A2. The degree of flexure can be detected by the MEMS device 100. That is, the MEMS sensor 205 can be used as a sensor similar to the impact sensor 200 and the earthquake intensity sensors 201 and can be more compact and thin than them.

The MEMS sensor 140A does not necessarily have the same configuration as that of the MEMS sensor 140 and may have the same configuration as the configuration of any of the MEMS device 100 and the MEMS sensors 110, 120, and 130.

The entire disclosure of Japanese Patent Application No. 2012-226669, filed Oct. 12, 2012 is expressly incorporated by reference herein.

What is claimed is:

1. A sensor comprising:
a flexible substrate; and
a resonator provided above a principal surface of the substrate, wherein the resonator includes:
  a first electrode disposed above the principal surface of the substrate, and
  a second electrode spaced apart from the first electrode and having an area that overlaps with the first electrode in a plan view, wherein
the resonator is deformable when an external force is applied to the substrate, the sensor includes a plurality of resonators, and the plurality of resonators are disposed so that extension directions in which each area where the first electrode and the second electrode overlap are oriented in different directions along the principal surface of the substrate in the plan view.

2. The sensor according to claim 1, wherein the first electrode or the second electrode, or the first and second electrodes deform when the substrate deforms, and a resonance frequency of the resonator changes.

3. The sensor according to claim 1, wherein the resonator is surrounded by a wall provided above the principal surface of the substrate.

4. A sensor comprising:

a flexible substrate;

a resonator provided above a principal surface of the substrate;

a frequency detection circuit that detects a resonance frequency of the resonator; and a storage section that stores at least one of the resonance frequency detected by the frequency detection circuit, a change amount in the resonance frequency, a maximum and a minimum of the resonance frequency, and a maximum and a minimum of the change amount in the resonance frequency, wherein the resonator is deformable when an external force is applied to the substrate.

5. The sensor according to claim 4, wherein the storage section stores information on a magnitude of the external force corresponding to the resonance frequency.

6. An electronic apparatus comprising the sensor according to claim 1.

7. An electronic apparatus comprising the sensor according to claim 4.

8. A robot comprising the sensor according to claim 1.

9. A robot comprising the sensor according to claim 4.

10. A mobile object comprising the sensor according to claim 1.

11. A mobile object comprising the sensor according to claim 4.

12. The sensor according to claim 4, further having a timer function, wherein temporal information is added to information stored in the storage section.

13. A sensor comprising:

a flexible substrate; and a resonator provided above a principal surface of the substrate, wherein the resonator includes:

a first electrode disposed above the principal surface of the substrate; and a second electrode disposed above the first electrode, the second electrode being spaced apart from the first electrode with an air gap, wherein the resonator is deformable when an external force is applied to the substrate, and the first electrode and the second electrode are partially overlapped with each other in a plan view.

14. The sensor according to claim 13, wherein the sensor includes a plurality of resonators, and the plurality of resonators are disposed so that directions in which an area where the first electrode and the second electrode overlap with each other extends are oriented in different directions along the principal surface of the substrate in the plan view.

15. An electronic apparatus comprising the sensor according to claim 13.

16. A robot comprising the sensor according to claim 13.

17. A mobile object comprising the sensor according to claim 13.

* * * * *